United States Patent
Palaniappan et al.

(10) Patent No.: US 7,635,914 B2
(45) Date of Patent: Dec. 22, 2009

(54) MULTI LAYER LOW COST CAVITY SUBSTRATE FABRICATION FOR POP PACKAGES

(75) Inventors: Prema Palaniappan, Richardson, TX (US); Masood Murtuza, Sugalr Land, TX (US); Satyendra Singh Chauhan, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 11/804,237

(22) Filed: May 17, 2007

(65) Prior Publication Data

US 2008/0283992 A1 Nov. 20, 2008

(51) Int. Cl.
*H01L 23/12* (2006.01)

(52) U.S. Cl. .............................. 257/686; 257/E23.007; 257/737

(58) Field of Classification Search .................. 257/678, 257/686, E23.007, E23.009, E23.127, E21.504, 257/E21.511
See application file for complete search history.

(56) References Cited

U.S. PATENT DOCUMENTS

| | | | |
|---|---|---|---|
| 5,858,816 A | 1/1999 | Sato et al. | |
| 6,084,297 A * | 7/2000 | Brooks et al. | 257/698 |
| 6,277,672 B1 | 8/2001 | Ho | |
| 2003/0209465 A1 | 11/2003 | Shoji | |
| 2006/0170092 A1 | 8/2006 | Kim et al. | |
| 2007/0059918 A1 | 3/2007 | Jung et al. | |

* cited by examiner

*Primary Examiner*—Roy K Potter
(74) *Attorney, Agent, or Firm*—Yingsheng Tung; Wade J. Brady, III; Frederick J. Telecky, Jr.

(57) ABSTRACT

In a method and system for fabricating a semiconductor device (100) having a package-on-package structure, a base laminate substrate (BLS) (110) is formed to include a base center portion (112) and a peripheral portion (114) separated by a barrier element (120). The barrier element (120) forms a peripheral wall (118) to surround the base center portion (112). A frame shaped top laminate substrate (TLS) (130) is disposed over the peripheral portion (114) of the BLS (110). The TLS (130) has an open top center portion (132) matching the base center portion (112) surrounded by the peripheral wall (118) to form a cavity (140). A plurality of conductive bumps (150) each disposed between a top contact pad (134) of the TLS and a base contact pad (116) of the peripheral portion (114) of the BLS (110) are formed to provide electrical and mechanical coupling therebetween. The barrier element (120) forms a seal between the cavity (140) and the plurality of conductive bumps (150).

13 Claims, 3 Drawing Sheets

MULTI LAYER LOW COST CAVITY SUBSTRATE FABRICATION FOR POP PACKAGES

BACKGROUND

The present invention is related in general to the field of semiconductor device assembly and packaging, and more specifically to fabricating integrated circuit (IC) devices having three dimensional packaging.

It is well known that the consumers of the next generation electronic devices are demanding increased functions and features that are packed in a smaller size, consuming less power, and costing less than the earlier generation. Semiconductor device manufacturers are responding by incorporating improved three dimensional packaging technologies such as systems in package (SiP), Multi-Chip Packages (MCPs), Package-on-Package (PoP), and similar others that provide vertical stacking of one or more dies and/or packages that are integrated to operate as one semiconductor device. For example, PoP packages are commonly used in products desiring efficient access to memory while reducing size, such as cellular telephones.

PoP typically includes at least one die such as a logic chip in a bottom package. A top surface of the substrate is used as a receptor to mount a top package such as a memory chip. The top package is electrically coupled to the bottom substrate by ball grid arrays (BGAs) or similar other. If there is more than one die in the bottom package, then a cavity substrate is desirable as it allows for a smaller mold cap that does not interfere with the top package. The cavity substrate may be fabricated as a monolith substrate or as multiple substrates attached together to form a center cavity. Formation of the center cavity in a monolithic substrate is typically costly and complex, whereas formation of the center cavity using multiple substrates is more cost effective. However, during an assembly of a PoP package, encapsulation of the die by a molding compound often results in the molding compound flowing between the multiple substrates in an unpredictable and uneven manner, thereby potentially inducing uneven stress.

SUMMARY

Applicant recognizes an existing need for an improved method and system for fabricating a semiconductor device using a package-on-package (PoP) type packaging; and the need for containing a molding compound within a center cavity created by using multiple substrates, absent the disadvantages found in the prior techniques discussed above.

The foregoing need is addressed by the teachings of the present disclosure, which relates to a system and method for assembly and packaging of semiconductor devices. According to one embodiment, in a method and system for fabricating a semiconductor device having a package-on-package structure, a base laminate substrate (BLS) is formed to include a base center portion and a peripheral portion separated by a barrier element. The barrier element forms a peripheral wall to surround the base center portion. A frame shaped top laminate substrate (TLS) is disposed over the peripheral portion of the BLS. The TLS has an open top center portion matching the base center portion surrounded by the peripheral wall to form a cavity. A plurality of conductive bumps each disposed between a top contact pad of the TLS and a base contact pad of the peripheral portion of the BLS are formed to provide electrical and mechanical coupling therebetween. The barrier element forms a seal between the cavity and the plurality of conductive bumps.

In one aspect of the disclosure, a method for fabricating a semiconductor device having a package-on-package structure includes forming a barrier element on a base laminate substrate, thereby separating the base laminate substrate into a base center portion and a peripheral portion. The formation of the barrier element includes forming a peripheral wall to surround the base center portion that is capable of mounting at least one die. A frame shaped top laminate substrate is attached to the base laminate substrate by bonding a top contact pad of the top laminate substrate and a base contact pad the peripheral portion of the base laminate substrate to one conductive bump of a plurality of conductive bumps disposed therebetween. The top laminate substrate includes an open top center portion matching the base center portion to form a cavity having an open top. The at least one die is mounted on the base center portion. The cavity is filled by a molding compound to encapsulate the at least one die. A top package is mounted on the top laminate substrate to provide the package-on-package structure.

Several advantages are achieved by the method and system according to the illustrative embodiments presented herein. The embodiments advantageously provide an improved PoP structure by providing a barrier element that forms a seal to substantially prevent the molding compound from flowing out of the cavity. The semiconductor device having the improved PoP structure is advantageously manufacturable by using existing laminate substrate materials and processes, and using existing interconnection materials and processes such as solder on paste. Use of existing materials and processes advantageously enables multiple substrate contractors to perform the manufacturing. Formation of the cavity by using two laminate substrates with a barrier element is more cost effective than a monolithic substrate design or by adhesively attaching the two laminate substrate without the barrier element. The cavity is advantageously capable of housing one or more dies connected to the base laminate substrate via selectable interconnection technologies such as wire bonding and flip chip or a combination thereof.

DETAILED DESCRIPTION

Figure 1A:
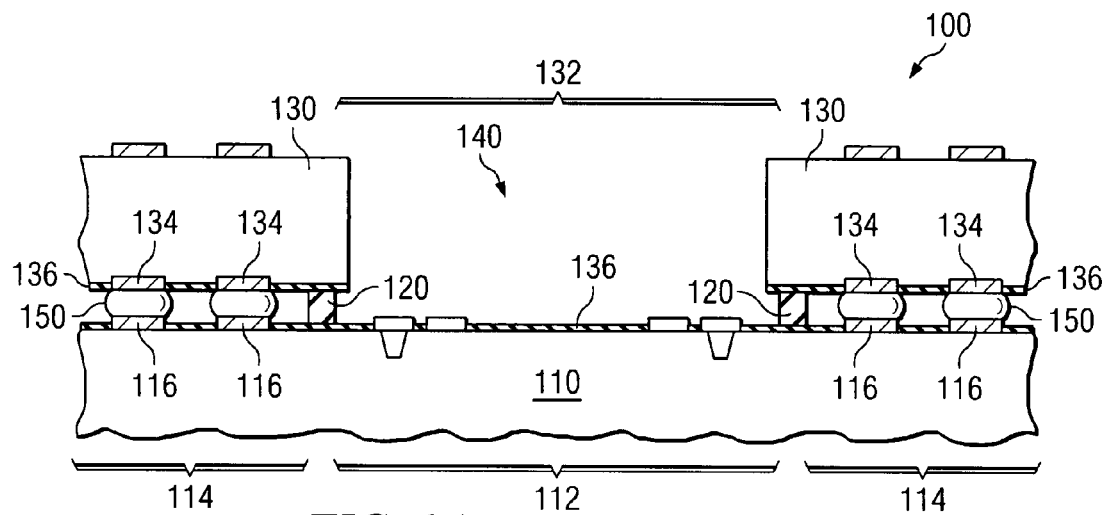
FIG. 1A illustrates a simplified and schematic cross section of a multilayer cavity substrate of a semiconductor device having a package-on-package structure, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Traditional tools and methods for fabricating a semiconductor device having a PoP structure typically use a cavity substrate for mounting a die. Traditional techniques for fabricating the cavity from a monolith substrate are often costly and complex. Fabricating a cavity substrate by using two substrates may be more cost effective but is often constrained by limitations. For example, encapsulation of the die by a molding compound often results in the molding compound flowing below the top substrate in an unpredictable and uneven manner, thereby potentially inducing uneven stress. This problem may be addressed by an improved system and method for fabricating a semiconductor device having a PoP structure. According to an embodiment, in a method and system for fabricating a semiconductor device having a package-on-package structure, a base laminate substrate (BLS) is formed to include a base center portion and a peripheral portion separated by a barrier element. The barrier element forms a peripheral wall to surround the base center portion. A frame shaped top laminate substrate (TLS) is disposed over the peripheral portion of the BLS. The TLS has an open top center portion matching the base center portion surrounded by the peripheral wall to form a cavity. A plurality of conductive bumps each disposed between a top contact pad of the TLS and a base contact pad of the peripheral portion of the BLS are formed to provide electrical and mechanical coupling therebetween. The barrier element forms a seal between the cavity and the plurality of conductive bumps. The fabrication of a semiconductor device having a PoP structure is described with reference to FIGS. 1A, 1B, 1C, 1D, 1E and FIG. 2.

The following terminology may be useful in understanding the present disclosure. It is to be understood that the terminology described herein is for the purpose of description and should not be regarded as limiting.

Semiconductor Package (or Package)—A semiconductor package provides the physical and electrical interface to at least one integrated circuit (IC) or die for connecting the IC to external circuits. The package protects the IC from damage, contamination, and stress that result from factors such as handling, heating, and cooling. The process of putting the IC inside a package to make it reliable and convenient to use is known as semiconductor package assembly, or simply 'assembly'.

Laminate Substrate—A substrate is an underlying material used to fabricate a semiconductor device. In addition to providing base support, substrates are also used to provide electrical interconnections between the IC chip and external circuits. Two categories of substrates that are used in ball grid array (BGA) packages for fabricating the semiconductor device include rigid and tape substrates. Rigid substrates are typically composed of a stack of thin layers or laminates, and are often referred to as laminate substrates. The laminate substrate is usually made of polymer-based material such as FR-4 or fiber-reinforced material such as BT (bismaleimide triazine). Other types of laminate substrates may include an organic substrate and a ceramic substrate. The laminate substrate may typically include multiple conductive layers, e.g., a '1/2/1' 4 metal layer substrate. In some applications, the laminate substrate may include a single layer of dielectric and a single layer of metal. Interconnecting patterns such as vias provide electrical coupling between the multiple layers. The conductive layers typically include traces of a metal foil bonded to a polymer substrate.

Ball-Grid Array (BGA)—An integrated circuit surface mount package with an area array of solder balls that are attached to the bottom side of a substrate with routing layers. The die base is attached to the substrate using die and wire bonding or flip-chip interconnection.

Figure 1B:
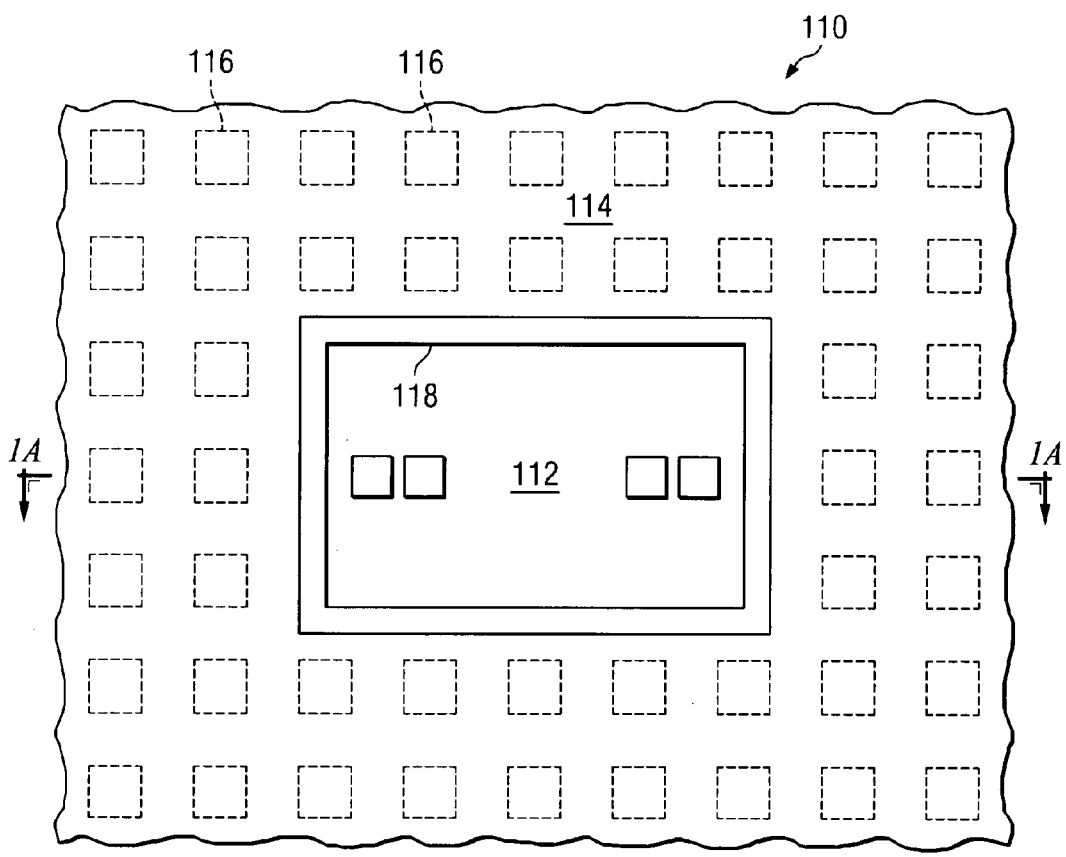
FIG. 1B additional details of a top view of a base laminate substrate of a semiconductor device described with reference to FIG. 1A, according to an embodiment.

FIG. 1A illustrates a simplified and schematic cross section of a multilayer cavity substrate of a semiconductor device 100 having a package-on-package structure, according to an embodiment. FIG. 1B illustrates additional details of a top view of a base laminate substrate of the semiconductor device 100 described with reference to FIG. 1A, according to an embodiment. Referring to FIG. 1A, the multilayer cavity substrate of the semiconductor device 100 includes a base laminate substrate 110 having a barrier element 120. The barrier element 120 separates the base laminate substrate 110 into a base center portion 112 and a peripheral portion 114. Referring to FIG. 1B, the barrier element 120 of the base laminate substrate 110 forms a peripheral wall 118 along a perimeter of the base center portion 112, thereby surrounding the base center portion 112. The barrier element 120 may include any elevated structure that extends from the plane of the base center portion 112. The base center portion 112 is suitable for mounting at least one die. The peripheral portion 114 of the base laminate substrate 110 includes a plurality of contact pads, including a base contact pad 116.

Referring back to FIG. 1A, a picture-frame shaped top laminate substrate 130 is disposed over and attached to the peripheral portion 114 of the base laminate substrate 110 via a plurality of conductive bumps 150. The top laminate substrate 130 has an open top center portion 132 matching the base center portion 112 that is surrounded by the peripheral wall 118 to form a cavity 140. Each one of the plurality of conductive bumps 150 is disposed between a top contact pad 134 of the top laminate substrate 130 and a base contact pad 116 of the peripheral portion 114 of the base laminate substrate 110, thereby providing electrical and mechanical coupling therebetween. Alternative techniques for attaching the base laminate substrate 110 to the top laminate substrate 130 may include adhesive coupling. However, the adhesive coupling technique may require use of new adhesive materials applied between the two laminate substrates, and the use of new interconnect technology, both of which carries a higher cost and are therefore a greater risk compared to coupling via the plurality of conductive bumps 150.

In an embodiment, each one of the base laminate substrate 110 and top laminate substrate 130 are rigid, multi-layer laminate substrates. As described earlier, rigid substrates are typically composed of a stack of thin layers or laminates, and are often referred to as laminate substrates. The laminate substrate is usually made of polymer-based material such as FR-4 or fiber-reinforced material such as BT (bismaleimide triazine). Other types of laminate substrates may include an organic substrate and a ceramic substrate. The thickness of the laminate substrates is approximately 150 micrometers, although thinner or thicker substrates may be possible depending on a number of layers included in the laminate substrate. In an exemplary, non-depicted embodiment, the base contact pad 116 and the top contact pad 134 may be interconnected by a conductive adhesive, a thermo compression weld, a high melting point solder contact, a plurality of conductive traces, vias, metal planes, bond wires, metal lands, bond wire areas, conductive pads and similar others. In an embodiment, the interconnect patterns may be established by various electrical connection techniques such as a conductive adhesive, a thermo compression weld, a high melting point solder contact, a plurality of conductive traces, vias, metal planes, bond wires, metal lands, bond wire areas, and conductive pads. In an embodiment, the base laminate substrate 110 is a 2 or more metal layer substrate, e.g., a 1/2/1 substrate, and the top laminate substrate 130 is at least one metal layer substrate.

A conductive bump as described herein is any conductive element that provides an interconnect between the two substrates. A conductive bump may be formed by applying a reflowable conductive material (such as reflowable solder in a paste, powder, or film form) to a contact pad. Other materials used for forming the conductive bump may include anisotropic conductive paste. Metals such as copper, gold metals or alloys thereof may also be used to form the conductive bump. In addition, traditional mechanical connection techniques such as spring, socket, and pin, may be used to provide the interconnect. The shape of the conductive bump may be in the form of a convex surface. A bottom surface of the top laminate substrate 130 excluding conductive surfaces such as the top contact pad 134 is coated with a layer of a solder resist material 136. Similarly, a top surface of the base laminate substrate 110 excluding conductive surfaces such as the base contact pad 116 is coated with a layer of the solder resist material 136.

The barrier element 120 forms a seal between the cavity 140 and the plurality of conductive bumps 150. Specifically, the barrier element 120 abuts the solder resist material 136 at a bottom surface of the top laminate substrate 130 to close any gaps or openings, thereby forming the seal. A height of the barrier element 120 is equal to a height of one of the plurality of conductive bumps 150 added to a height for each one of the top contact pad 134 and the base contact pad 116. In an embodiment, the barrier element 120 is formed from one of a solder resist material and an adhesive material. The material used for the barrier element 120 may be cured to harden, thereby becoming an integral part of the base laminate substrate 110.

Described below are additional details of a process to fabricate the base laminate substrate 110, a process to fabricate the base laminate substrate 110 with the barrier element 120 formed from the solder resist material, and a process to fabricate the base laminate substrate 110 with the barrier element 120 formed from the adhesive material. In an embodiment, it may be desirable to use the solder resist material for the barrier element 120 compared to the use of adhesive material since the process using solder resist material is a batch process, is more uniform, and provides a tighter control on dimensions.

In a particular embodiment, the base laminate substrate 110 is fabricated using the following process flow. Incoming material→Drill-desmear→Plating→dry film resist (DF) laminate-exposure-development→Plating→Strip and Etch→outer layer lamination→Drill→Plating→Imaging→Strip and Etch→Solder resist application (allows for both film or liquid solder resist)→optional partial cure (if required, only applicable if liquid solder resist is used)-exposure-development-full cure.

In a particular embodiment, the base laminate substrate 110 with the barrier element 120 is formed from a solder resist material and may be fabricated using the following process flow. Incoming material→Drill-desmear→Plating→dry film resist (DF) laminate-exposure-development→Plating→Strip and Etch→outer layer lamination→Drill→Plating→Imaging→Strip and Etch→Solder resist application→optional partial cure (if required, only applicable if liquid solder resist is used)-exposure-development-full cure→solder resist application→optional partial cure (if required, only applicable if liquid solder resist is used)-exposure-develop-final cure. Therefore, the process for fabricating the barrier element 120 is the same as the process for fabricating the base laminate substrate 110 except for the additional steps of forming multiple layers of the solder resist material, one layer at a time, and exposing, developing, fully curing the layers. The imaging and developing process allows for undesired solder resist material to be removed. The layers of the solder resist material are built up until desired height of the barrier element 120 is achieved. The substrate is fully cured, e.g., by using ultraviolet light, to complete cross linking in solder resist material. Examples of solder resist materials may include PFR 800, AUS 703, and AUS 705.

In a particular embodiment, the base laminate substrate 110 with the barrier element 120 is formed from an adhesive material and may be fabricated using the following process flow. Incoming material→Drill-desmear→Plating→dry film resist (DF) laminate-exposure-development→Plating→Strip and Etch→outer layer lamination→Drill→Plating→Imaging→Strip and Etch→Solder resist application→optional partial cure (if required, only applicable if liquid solder resist is used)-exposure-development-full cure→dispense adhesive material around edge of top center portion (e.g., location of the peripheral wall)→cure. Examples of adhesive barrier materials may include epoxy material such as Sumitomo CRP 3300T.

Figure 1C:
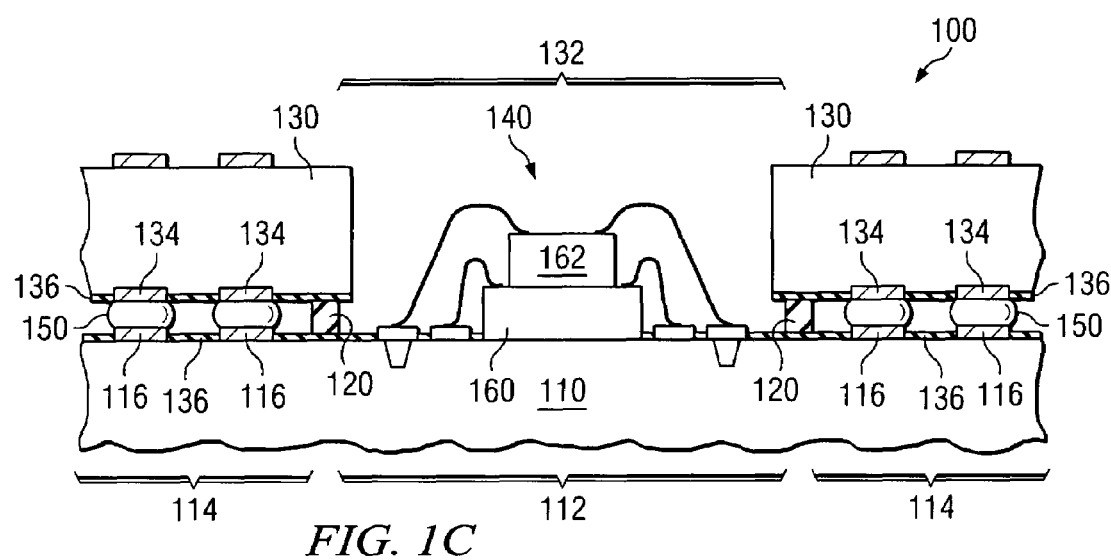
FIG. 1C illustrates a simplified and schematic cross section of a multilayer cavity substrate housing at least one die of a semiconductor device described with reference to FIG. 1A and FIG. 1B, according to an embodiment.

FIG. 1C illustrates a simplified and schematic cross section of a multilayer cavity substrate housing at least one die of a semiconductor device 100 described with reference to FIG. 1A and FIG. 1B, according to an embodiment. The cavity 140, which is formed by the base center portion 112, an inner surface of the barrier element 120, and an inner surface of the top center portion 132, houses at least one die. In the depicted embodiment, a first die 160 is attached to the base center portion 112 by a die attach compound (not shown). A second die 162 is attached to the first die 160. Although the first die 160 and the second die 162 are shown to be connected to the base center portion 112 as wire bond connections, it is understood that different connection techniques such as flip chip or a combination of wire bond on one die and flip chip on another die may be used to electrically couple the dies to one another or to the contact pads. In an embodiment, the height of the barrier element 120 is adjustable in dependence of a number of dies and connection technique used, such as flip chip or wire bond. In an exemplary, non-depicted embodiment, the at least one die included in the semiconductor device 100 is one of a microprocessor, a digital signal processor, a radio frequency chip, a memory, a microcontroller, an application specific integrated circuit, and a system-on-a-chip or a combination thereof.

Figure 1D:
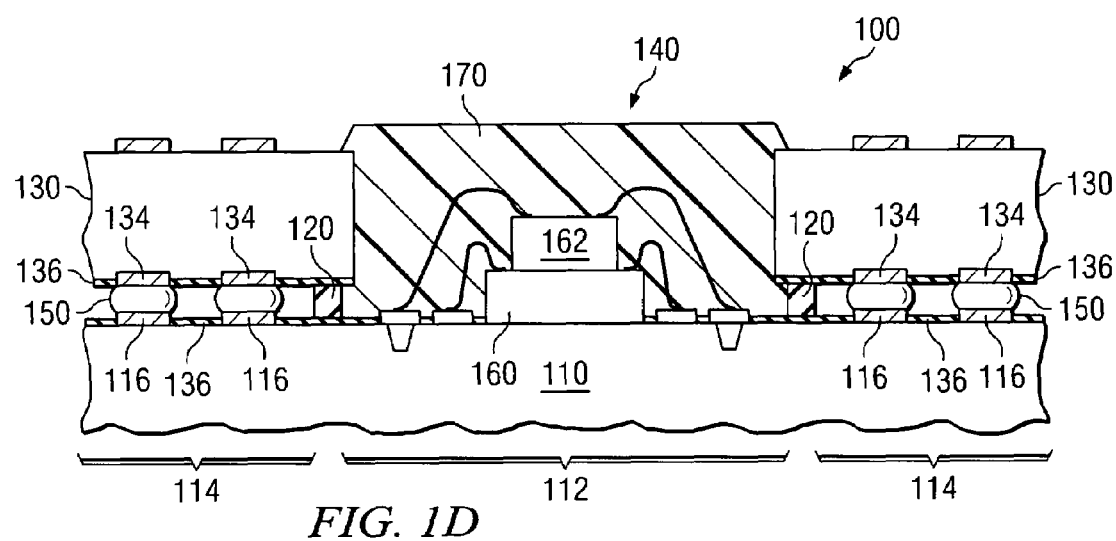
FIG. 1D illustrates a simplified and schematic cross section of a cavity of a semiconductor device described with reference to FIGS. 1A, 1B and 1C filled with a molding compound, according to an embodiment.

FIG. 1D illustrates a simplified and schematic cross section of a cavity of a semiconductor device 100 described with reference to FIGS. 1A, 1B and 1C filled with a molding compound, according to an embodiment. In the depicted embodiment, the cavity 140 is filled with a polymeric or molding compound 170 to protect the first and second dies 160 and 162. The molding compound 170 is advantageously prevented from leaking out of the cavity 140 by the seal formed with the barrier element 120. The barrier element 120 substantially prevents the molding compound 170 to make contact with the plurality of conductive bumps 150. That is, the barrier element 120 creates a region disposed between the top laminate substrate, the base laminate substrate and the seal that is void of the molding compound 170.

Figure 1E:
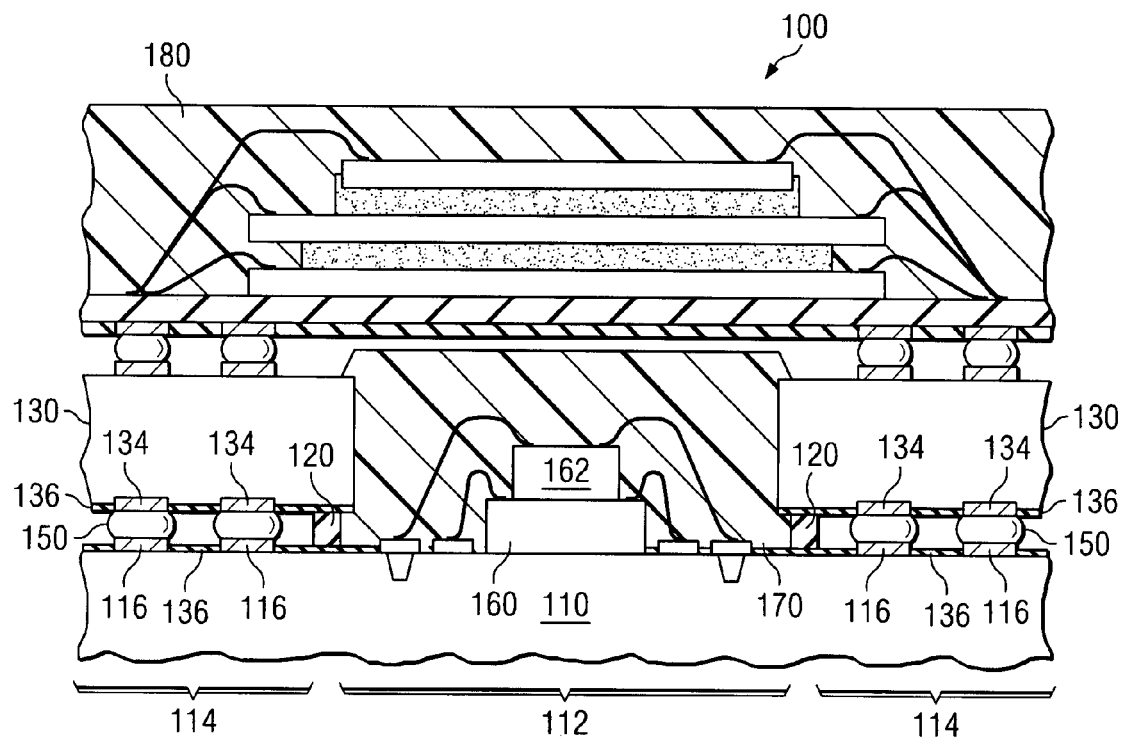
FIG. 1E illustrates a simplified and schematic cross section of a semiconductor device having a package-on-package structure described with reference to FIGS. 1A, 1B, 1C and 1D, according to an embodiment.

FIG. 1E illustrates a simplified and schematic cross section of a semiconductor device 100 having a package-on-package structure described with reference to FIGS. 1A, 1B, 1C and 1D, according to an embodiment. A top package 180 such as a memory chip is mounted on the top laminate substrate 130 to complete the assembly of the semiconductor device 100 having the package-on-package structure. The top package 180 may be coupled to the top laminate substrate 130 using a ball-grid array (BGA). In an exemplary, non-depicted embodiment, the semiconductor device 100 may be mounted using a ball-grid array (BGA).

Figure 2:
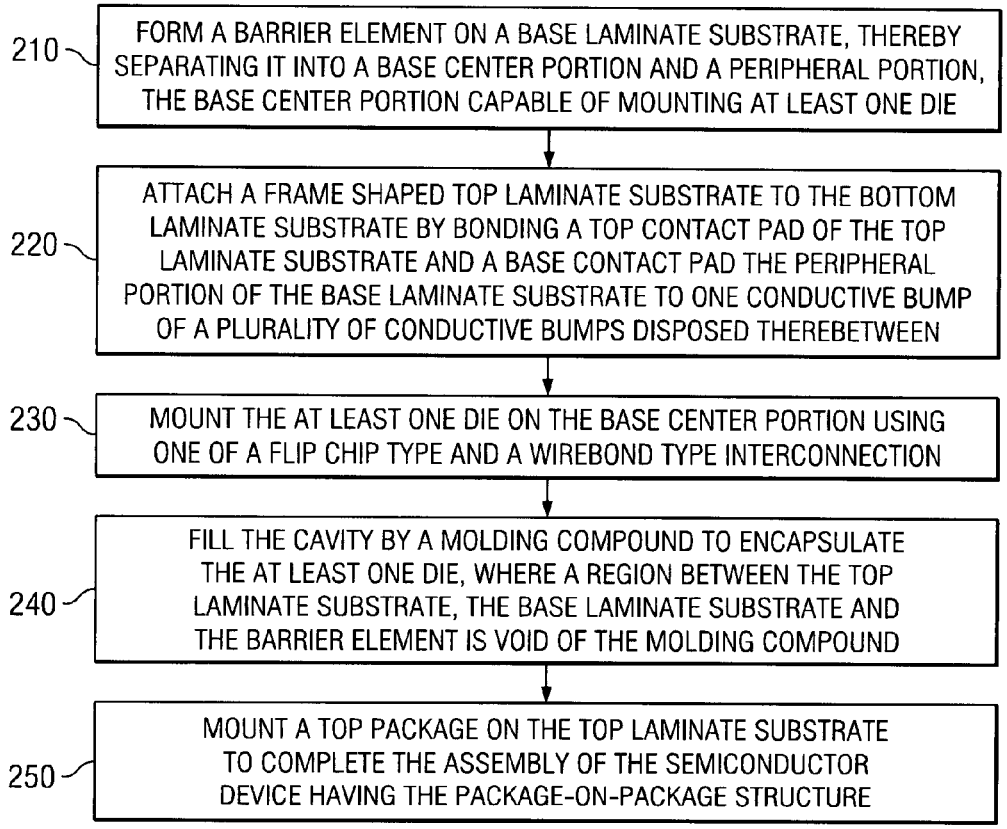
FIG. 2 is a flow chart illustrating a method for fabricating a semiconductor device having a package-on-package structure, according to an embodiment.

FIG. 2 is a flow chart illustrating a method for fabricating a semiconductor device having a package-on-package structure, according to an embodiment. In a particular embodiment, FIG. 2 illustrates the process for fabricating the semiconductor device 100 described with reference to FIGS. 1A, 1B, 1C, 1D and 1E. At step 210, a base laminate substrate having a barrier element is formed. The barrier element separates the base laminate substrate into a base center portion and a peripheral portion. The formation of the barrier element includes forming a peripheral wall around a perimeter of the base center portion to surround it. The base center portion is capable of mounting at least one die. The peripheral portion includes a plurality of base contact pads. At step 220, a frame shaped top laminate substrate is attached to the base laminate substrate by bonding a top contact pad of the top laminate substrate and a base contact pad the peripheral portion of the base laminate substrate to one conductive bump of a plurality of conductive bumps disposed therebetween. The top laminate substrate includes an open top center portion matching the base center portion to form a cavity. The bonding of the top and the base contact pads to the plurality of conductive bumps disposed therebetween is performed in accordance with one of a solder on pad method. The bonding provides mechanical and electrical coupling between the base laminate substrate and the top laminate substrate. At step 230, the at least one die is mounted on the base center portion using one of a flip chip type and a wirebond type interconnection. At step 240, the cavity is filled by a molding compound to encapsulate the at least one die. The barrier element substantially prevents the molding compound to make contact with the plurality of conductive bumps. At step 250, a top package is mounted on the top laminate substrate to complete the assembly of the semiconductor device having the package-on-package structure.

Various steps described above may be added, omitted, combined, altered, or performed in different orders. For example, step 220 may be divided into a step for forming a top laminate substrate and a step for attaching the top laminate substrate to the base laminate substrate via the plurality of conductive bumps.

Several advantages are achieved by the method and system according to the illustrative embodiments presented herein. The embodiments advantageously provide an improved PoP structure by providing a barrier element that forms a seal to substantially prevent the molding compound from flowing out of the cavity. The semiconductor device having the improved PoP structure is advantageously manufacturable by using existing laminate substrate materials and processes, and using existing interconnection materials and processes such as solder on pad. Use of existing materials and processes advantageously enables multiple substrate contractors to perform the manufacturing. Formation of the cavity by using two laminate substrates with a barrier element is more cost effective than a monolithic substrate design or by adhesively attaching the two laminate substrate without the barrier element. The cavity is advantageously capable of housing one or more dies connected to the base laminate substrate via selectable interconnection technologies such as wire bonding and flip chip or a combination thereof.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of conventional mounting with wire bonding, those of ordinary skill in the art will appreciate that the processes disclosed are capable of being used for assembly of semiconductor devices using different types of mounting techniques.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A semiconductor device comprising:
 a base laminate substrate having a base center portion and a peripheral portion separated by a barrier element, the barrier element forming a peripheral wall to surround the base center portion;

a picture-frame shaped top laminate substrate disposed over the peripheral portion of the base laminate substrate, the top laminate substrate having an open top center portion matching the base center portion surrounded by the peripheral wall to form a cavity; and a plurality of conductive bumps, each one of the plurality of conductive bumps disposed between a top contact pad of the top laminate substrate and a base contact pad of the peripheral portion of the base laminate substrate to provide electrical and mechanical coupling therebetween, the barrier element forming a seal between the cavity and the plurality of conductive bumps.

2. The device of claim 1 further comprising:

at least one die attached to the base center portion; and a molding compound to encapsulate the at least one die and fill the cavity, wherein a region disposed between the top laminate substrate, the base laminate substrate and the seal is void of the molding compound.

3. The device of claim 2, wherein the at least one die is selectable to be one of a flip chip die and a wirebond die.

4. The device of claim 2, wherein the at least one die includes a first die mountable as a flip chip die and a second die stackable on the first die, the second die being mountable as a wirebond die.

5. The device of claim 2, wherein the at least one die includes a first die mountable as a wirebond package and a second die stackable on the first die, the second die being mountable as another wirebond package.

6. The device of claim 2, wherein the at least one die is one of a microprocessor, a digital signal processor, a radio frequency chip, a memory, a microcontroller, and a system-on-a-chip or a combination thereof.

7. The device of claim 1, wherein a height of the barrier element is equal to a height of one of the plurality of conductive bumps added to a height for each one of the top and the base contact pads.

8. The device of claim 1, wherein the barrier element is formed from one of a solder resist material and an adhesive material.

9. The device of claim 1, wherein the top laminate substrate includes at least one metal layer.

10. The device of claim 1, wherein the barrier element abuts a bottom surface of top laminate substrate to form the seal.

11. The device of claim 1, wherein the plurality of conductive bumps are fabricated from a reflowable solder paste material.

12. The device of claim 11, wherein the base laminate substrate is fabricated from one of an organic substrate, a ceramic substrate, a glass epoxy substrate, and a bismaleimide triazine (BT) substrate.

13. The device of claim 1, wherein a bottom surface of the top laminate substrate excluding the top contact pads is coated with a layer of a solder resist material.

* * * * *